(12) United States Patent
Alpert et al.

(10) Patent No.: US 11,909,224 B2
(45) Date of Patent: Feb. 20, 2024

(54) PHOTOVOLTAIC CELL FOR LASER BEAM POWER DETECTION

(71) Applicant: Wi-Charge Ltd., Rehovot (IL)

(72) Inventors: Ortal Alpert, Ness Ziona (IL); Ori Refael Mor, Tel Aviv (IL); Lior Golan, Ramat Gan (IL); Ran Sagi, Tel Aviv (IL); Eyal Conforti, Tel Aviv (IL)

(73) Assignee: Wi-Charge Ltd., Rehovot (IL)

(*) Notice: Subject to any disclaimer, the term of this patent is extended or adjusted under 35 U.S.C. 154(b) by 270 days.

(21) Appl. No.: 17/440,809

(22) PCT Filed: Mar. 20, 2020

(86) PCT No.: PCT/IL2020/050336
§ 371 (c)(1),
(2) Date: Sep. 20, 2021

(87) PCT Pub. No.: WO2020/188576
PCT Pub. Date: Sep. 24, 2020

(65) Prior Publication Data
US 2022/0190649 A1 Jun. 16, 2022

Related U.S. Application Data

(60) Provisional application No. 62/821,143, filed on Mar. 20, 2019.

(51) Int. Cl.
*H02J 50/30* (2016.01)
*H01L 31/054* (2014.01)
(Continued)

(52) U.S. Cl.
CPC ........ *H02J 50/30* (2016.02); *H01L 31/02168* (2013.01); *H01L 31/0547* (2014.12); *H02S 40/30* (2014.12); *Y02E 10/52* (2013.01)

(58) Field of Classification Search
CPC .... H02J 50/30; H04B 10/807; H01L 31/0547; H01L 31/054; H01L 31/02168;
(Continued)

(56) References Cited

U.S. PATENT DOCUMENTS 9,312,701 B1 4/2016 Mor
2007/0125415 A1 6/2007 Sachs
(Continued)

FOREIGN PATENT DOCUMENTS

WO WO-2013092259 A2 * 6/2013 ........... G02B 5/0205
WO 2018014131 A1 1/2018

OTHER PUBLICATIONS

European Extended Supplementary Search Report in EP Appl. No. 20773899.8, dated Jan. 2, 2023, 10 pages.
(Continued)

*Primary Examiner* — Ryan Johnson
(74) *Attorney, Agent, or Firm* — Maine Cernota & Curran

(57) ABSTRACT

A wireless optical power transmission system comprising a transmitter and receiver, the transmitter comprising a laser emitting a beam, a scanning mirror for steering the beam towards said receiver and a control unit receiving signals from a detection unit on the receiver and controlling the beam power and the scanning mirror. The receiver has a photovoltaic cell having a bandgap energy of 0.75-1.2 e V, with a plurality of conductors on abeam receiving surface. A cover layer of material blocking illumination of wavelengths outside that of the laser, is disposed on the photovoltaic cell. The cover layer may have anti-reflective coatings on its top and bottom surfaces. The detection unit thus generates a signal representing the power of the laser beam impinging upon the receiver, independent of illuminations other than that of said laser beam. The control unit thus can maintain the laser power impinging on the receiver.

3 Claims, 9 Drawing Sheets

(51) Int. Cl.
 H02S 40/30 (2014.01)
 H01L 31/0216 (2014.01)
(58) Field of Classification Search
 CPC ... H01L 31/02167; H02S 40/20; H02S 40/22; Y02E 10/52; Y02E 10/50
 See application file for complete search history.

(56) References Cited

U.S. PATENT DOCUMENTS

| | | | |
|---|---|---|---|
| 2008/0092942 A1* | 4/2008 | Kinsey | H01L 31/022433 136/252 |
| 2009/0255569 A1 | 10/2009 | Sampsell | |
| 2010/0096011 A1 | 4/2010 | Griffiths | |
| 2013/0112256 A1 | 5/2013 | Yu | |
| 2015/0054342 A1* | 2/2015 | Kim | H02J 50/30 307/66 |
| 2015/0187971 A1* | 7/2015 | Sweeney | H02J 50/30 307/151 |
| 2017/0033250 A1 | 2/2017 | Ballif | |
| 2017/0346347 A1 | 11/2017 | Abriri | |
| 2019/0036476 A1 | 1/2019 | Xu | |

OTHER PUBLICATIONS

Stuart R. Wenham et al "Applied Photovoltaics" 3rd edition copyrighted 2012. p. 62. ISBN-13: 978-1849711425 ISBN-10: 1849711429.

Lumb et al. "GaSb-Based Solar Cells for Full Solar Spectrum Energy Harvesting" Adv. Energy Matter. 2017, 1700345 (2017).

T.N.D Tibbits et al. "Comparison of direct growth and wafer bonding for the fabrication of GaInP/GaAs dual-junction solar cells on silicon" 29th PV Solar Energy Conference and Exhibition, Sep. 2014, Amsterdam, The Netherlands.

Garcia-Linares "Reduction of front-metallization grid shading in concentrator cells through laser micro-grooved cover glass" AIP Conference Procedings 1679, 06001 (2016), doi: 10.1063/1.4931535.

K Shanks et al. "Optics for concentrating photovoltics: Trends, limits and opportunities for materials and design" Renewable and Sustainable Energy Reviews, 60 (2016), pp. 394-407 (2016).

A.W. Blakers "Shading losses of solar-cell metal grids", Journal of Applied Physics, vol. 71, 5237 (1992).

Grid Calculator. PV Lighthouse. (n.d.). Retrieved Jan. 31, 2023, from https://www2.pvlighthouse.com.au/calculators/Grid%20calculator/Grid%20calculator.aspx.

Green, M. A. (2017). Corrigendum to 'solar cell efficiency tables (version 49)'[prog. Photovolt: Res. appl. 2017; 25:3-13]. Progress in Photovoltaics: Research and Applications, 25(4), 333-334.

International Search Report and Written Opinion for PCT Appl. No. PCT/IL2020/050336 dated Jun. 22, 2020, 19 pages.

International Preliminary Report on Patentability for PCT Appl. No. PCT/IL2020/050336 dated Sep. 30, 2021, 8 pages.

* cited by examiner

100mm

PHOTOVOLTAIC CELL FOR LASER BEAM POWER DETECTION

RELATED APPLICATIONS

This application is a national phase application filed under 35 USC § 371 of PCT Application No. PCT/IL2020/050336 with an International filing date of Mar. 20, 2020, which claims priority of U.S. provisional patent 62/821,143, with a filing date of Mar. 20, 2019. Each of these applications is herein incorporated by reference in its entirety for all purposes.

FIELD

The present invention relates to the field of photovoltaic cells, especially photovoltaic cells adapted to convert a beam from a laser power source into electrical energy in a wireless power system.

BACKGROUND

Photovoltaic cells, known as PV cells, are designed and used in many systems to convert light (visible or invisible) into electrical energy. In wireless power supply systems, photovoltaic cells are used to convert laser light directed at the cell from a transmitter, into usable electricity. In such a system, measuring the amount of laser light received by the cell accurately is of importance for many reasons, such as maintaining correct aim of the beam, maintaining safe operation of the system and efficiently converting the power generated by the photovoltaic cell into usable, stable, electrical power.

In a typical photovoltaic cell, light is converted into electrical energy using one or more p-n junctions, and is extracted from the cell using two electrodes. The bottom electrode is usually metallic coating while there are typically two options for the top electrode:
  (i) A metallic grid, typically of aluminum, silver or gold, which has a low series resistance, but reflects that part of the light falling on the grid itself, and preventing it from entering the cell.
  (ii) A continuous almost transparent conductive coating such as Indium Tin Oxide (ITO), which transmits most of the light into the cell but has a higher resistance than a metallic grid construction, causing higher Ohmic losses.

With metallic grids, there is typically a tradeoff between Ohmic losses and optical losses due to reflection from the metal grid. The Ohmic losses, measured by $V^2/R$, V being the voltage of the cell and R being the series resistance, decrease as the metal coverage of the cell increases, while the optical losses, known as the "shading effect", increase as the metal coverage of the cell increases. There is typically an optimal balance between these two factors, which is typically dependent on the expected cell illumination and the current of the PV cell.

In the article "GaSb-Based Solar Cells for Full Solar Spectrum Energy Harvesting" by Lumb et al, published in Adv. Energy Mater. 2017, U.S. Pat. No. 1,700,345 (2017), there is claimed to have been developed PV cells achieving 44.5% efficiency in converting sunlight into electricity.

According to Green at al, (Prog. Photovolt: Res. Appl. 2017; 25:3-13, published online 28 Nov. 2016 in Wiley Online Library (wileyonlinelibrary.com). DOI: 10.1002/pip.2855), there is reported that the highest reported PV efficiency was 46%, as published in the article entitled "Comparison of direct growth and wafer bonding for the fabrication of GaInP/GaAs dual-junction solar cells on silicon" by T. N. D Tibbits et al, presented at the $29^{th}$. PV Solar Energy Conference and Exhibition, September 2014, Amsterdam, The Netherlands.

In the article "Reduction of front-metallization grid shading in concentrator cells through laser micro-grooved cover glass" by Garcia-Linares, published in AIP Conference Proceedings 1679, 060001 (2016); doi: 10.1063/1.4931535, there is suggested a complex glass "lenslet", designed to concentrate light away from the conductor grid, thereby minimizing grid losses. Such a complex lenslet pattern requires exact placement relative to the metallic grid and is not widely used.

Unless such complex "lenslet" optics is used, the normal tradeoff exists between Ohmic losses and shading losses, and a typical result is for optical losses in the range 2-10%, and similar Ohmic losses for high concentration cells.

In a review by K. Shanks et al, entitled "Optics for concentrating photovoltaics: Trends, limits and opportunities for materials and design", published in Renewable and Sustainable Energy Reviews, 60 (2016), pp. 394-407 (2016), covering currently available PV optics, there is stated that an improvement of 3-20% of cell efficiency would be possible in photovoltaic cells should the tradeoff between conductor proportions and optical shading be eliminated without the use of complex structure optics requiring accurate placement with regards to the metallic grid.

In the article "Shading losses of solar-cell metal grids" to A. W. Blakers, published in the Journal of Applied Physics, Vol 71, 5237 (1992), there is described a system for minimizing shading losses. It is proposed to use rounded, finger shaped conductors, rather than the typically flat rectangular shaped conductors, the finger shapes directing more of any incident light reflected from the PV element surface, back down onto the PV element surface for absorption.

Optimization screens are used by PV designers to optimize prior art PV cell conductors. One such example of a grid calculator, can be shown in: http://www2.pvlighthouse.com.au/calculators/Grid%20calculator/Grid%20calculator.aspx In using such a grid calculator, the user can choose between different shapes of conducting fingers (rectangular, triangular, elliptical, pseudo-rectangular) and different materials, widths and heights. The user however cannot choose any optical cover layer for the cell and cannot optimize such coating. Optimizing the grid using this tool enables comparison of the different tradeoffs between different cell metal coverage. The same site defines shading losses as "Shading losses are caused by the presence of metal on the top surface of the solar cell which prevents light from entering the solar cell. The shading losses are determined by the transparency of the top surface, which, for a planar top surface, is defined as the fraction of the top surface covered by metal. The transparency is determined by the width of the metal lines on the surface and on the spacing of the metal lines. An important practical limitation is the minimum linewidth associated with a particular metalization technology. For identical transparencies, a narrow line-width technology can have closer finger spacing, thus reducing the emitter resistance losses."

The current regular approach to optimizing conductor grids can also be learned from the book "Applied Photovoltaics", by Stuart R. Wenham et al, 3rd edition copyrighted 2012. On page 62 in the on-line reference, there is stated that "The optimum width of the busbar (Wb) occurs when the resistive loss in the busbar equals its shadowing loss" and shows the different methods known in the art to mitigate such losses. While different options to increase light trapping in the cell are discussed, no option to recycle the reflected light is mentioned.

However, while the PV cells described in the such references provide high efficiencies, they are generally optimized for maximum efficiency in converting solar energy into electrical energy, which may have different technical requirements form the conversion of the power of a laser beam into electrical energy.

There therefore exists a need for a photovoltaic cell for converting a wirelessly transmitted laser beam into electrical power, which overcomes at least some of the disadvantages of prior art systems and methods.

The disclosures of each of the publications mentioned in this section and in other sections of the specification, are hereby incorporated by reference, each in its entirety.

SUMMARY

The present disclosure describes new exemplary systems for use within a wireless laser power transmission system, comprising a PV cell having a cover layer, for use in converting the power of a laser beam into electrical energy. The configurations described in this disclosure seek to improve photovoltaic efficiency, and to increase the safety and accuracy of power measurements performed using these PV cells, by achieving several objectives at the same time:
a) Reducing the dependence between metallic finger coverage and shading (shadowing)
b) Reducing the amount of light reflected from the cells.
c) Recycling reflected light into electrical energy.
d) Reducing the Ohmic losses in the series resistance of the conductors.
e) Improving the accuracy of laser power measurement using the photovoltaic cell, when illuminated from different angles.
f) Improving the accuracy of laser power measurement using the photovoltaic cell, when used in different lighting conditions, such as outside, inside, or near a heat source.
g) Confirming that the directed transmitted laser power is reaching its intended receiver, and at the intended power level, i.e. that no unreasonable level of power is getting "lost" en-route.

In many cases a wireless laser power transmission system's beam aiming mechanism, and/or the system's safety mechanism is dependent upon the accurate measurement of laser power received by the photovoltaic cell. For example, if the laser aiming is adjusted until a maximum power from the PV is generated, accurate aiming may be compromised by sunlight that may bias the measurement for a portion of the time, such as if the cell is illuminated one moment and not illuminated the next. In systems where safety is dependent on power measurements, illumination from different directions should optimally give similar power measurement results, and sunlight, or a heat source, should never bias the measurement results beyond a small safe limit. The devices of the present disclosure allow the measurement to be essentially independent of illumination direction and of other light sources of different wavelengths that may illuminate the system.

Should the light reflected by the photovoltaic cell, both from the front surface and from the conductors, be collected, and directed towards areas of the cell that are not covered by the metallic grid, it would be possible to increase the coverage of the metallic grid and therefore reduce the Ohmic losses, while at the same time reducing the shading effect and allowing for the accurate optical power estimation based on generated electrical power, in a manner independent of beam direction, and even beam uniformity. With narrow conductors, as in prior art cells, if the beam illuminates just a portion of the cell, the narrow conductors would create larger Ohmic losses than for uniform illumination, and hence, optical power estimation based on electrical power or current would be inaccurate. On the other hand, the currently described configurations allow for lower Ohmic losses and hence more accurate optical power estimation based on electrical power measurement.

However, light is applied onto the photovoltaic cell from different directions and is reflected by the grid in a complex pattern that may include several orders of the Bragg reflection, typically caused by the periodic structure of the grid. This effect creates many problems. Firstly, the reflected light is lost and reduces the efficiency. Secondly, the reflected light may be a safety hazard. Thirdly, since the amount of reflected light is dependent on the direction of illumination, optical power measurement by the photovoltaic cell would be inaccurate and would become less useful for safety and aiming purposes. In many cases, the system's safety mechanism is dependent upon the accurate measurement of laser power received by the photovoltaic cell.

In a typical wireless power system that does not include PV reorientation when the beam direction is changed, i.e. the PV does not tilt automatically to maximize power, the laser can illuminate the cell from almost any direction, typically such a system would work for up to 60 degrees from the normal to the cell's surface. Consequently, light reflected from the conductors would be reflected to different angles spreading some +−70 degrees, or even more from the normal to the cell, with the main reflection at the opposite angle to the incoming beam. If a symmetrical field of view is to be maintained, such that the beam can come from any side of the PV, then any collection system positioned inside that field of view would have to be transparent, (including any support structures of the optical elements, or it would obstruct the cell's ability to collect light from those directions.

An efficient collection system would also have to cover a significant portion of the various directions inside this field of view to be efficient, such that if a beam is incident from one direction, and generates a reflected beam towards another, in order for the collection system to intercept and collect the reflected beam in that other direction, it must inevitably block incident light coming in that other direction, since the collection system is opaque. In other words, expressed in terms of the serviced field of view, any incident angle that is included in the field of view, would create a reflection in some direction. If the light going to this direction (or the reflection) is to be recycled, then an opaque collection system would have to be placed in the direction of reflection, effectively eliminating this direction from the field of view.

It is an objective of the current invention to introduce such a system, that would improve the efficiency, aiming accuracy, and safety of such systems.

In one exemplary implementation, the shape of the conductors on the PV is chosen so that they reflect light in a wide pattern. Typical structures depend mainly, on manufacturing capabilities and the expected field of view of the incoming light, namely the angles from which the light might come, but, as a general concept, the common flat surfaces square or rectangular conductor grids are not preferred, while rounded and triangular grids are more advantageous.

The current system may use PVs having conductors which are optimally shaped to prevent shading loss. The shapes of the conductors on the PV may be chosen so that they reflect light in a wide pattern. For example, the conductors may be rounded and finger shaped, or triangularly shaped. This may cause reflections off the conductors either to be directed onto the absorbing PV cells, or totally internally reflected by a cover layer over the cell, thus increasing the efficiency of the system. This may also prevent dangerous reflections from being reflected from the PV cell, such as could be damaging to the eye, as the light reflected off the conductors would be diffused, and would therefore not be reflected in a uniform way.

The PV configuration of the present disclosure, differs significantly from prior art PVs in that the cover layer may be coated with anti-reflective (AR) coatings on both of its interface surfaces, namely an outer AR coating between the cover layer and the air outside, and an inner AR coating between the cover layer and the light absorbing surface of the PV cell material.

The outer anti-reflective (AR) coating is adapted to transmit essentially only the laser beam's wavelengths, typically infra-red, and reflect all other wavelengths impinging upon it that are likely to be present in extraneous illumination, and that would affect the ability of the PV cell to measure the laser wavelengths. Thus, the AR coating need not reflect any wavelengths to which the PV cell is insensitive, such as those in the mid- and far-infra red, or in the UV, since they will not affect the measurement at the laser wavelengths.

Additionally, the cover layer should comprise a material which absorbs wavelengths other than the beam's wavelength, so that any wavelengths not reflected by the AR coating are absorbed by the cover layer and thus do not reach the p-n junction(s) of the PV cell, so as not to generate inaccurate readings of the amount of laser power transmittance. Thus, the upper layers of the PV cell should, like the cover layer itself, be absorptive to the visible wavelengths which may not have been reflected by the AR coatings, and which can thus enter the upper levels of the semiconductor PV cell material itself. This is achieved by selection of the upper layers of the PV cell material having a sufficiently low bandgap.

One purpose of blocking wavelengths other than that of the laser beam, from reaching the p-n junction of the PV absorbing cells, is that when the receiver is acting as a safety power meter for the transmitter, it should provide accurate readings of the amount of laser beam impinging upon it. Thus other incident illuminations should not interfere with this measurement, and therefore should be blocked before impinging upon the absorbing PV cells.

Furthermore, the cover layer should have a high refractive index, so as to lower the critical angle for total internal reflection (TIR) and thus trap as much of the laser beam which has entered it, and which is reflected off the surface and the conductors as possible. This effect is explained more fully hereinbelow. This is in order to maximize the amount of illumination reaching the absorbing PV cells, since a portion of the beam that is reflected off the conductors may be re-reflected off the cover layer, and thus prevented from escaping out of the PV cell, which would have occurred if there had been no cover layer.

This also has the advantage that any light leaving the PV cells after multiple reflections inside the cover layer, between the PV cell surface, the conductors and total internal reflection off the top of the cover layer, will be in different, "random" directions and positions. This is as opposed to some prior art PV configurations, which reflect the beam in a more uniform way.

The top of the absorbing PV layer, which is the bottom of the cover layer, may also be coated with an AR coating, which maximizes absorption into the PV cell material of any light impinging from the cover layer.

According to a further implementation, and using the advantages provided by the double anti-reflection coated cover layer, a wireless optical power transmission system is described, comprising a transmitter, a receiver and a control unit, in which:

a) the transmitter includes a laser adapted to emit a beam, and a scanning mirror adapted for steering the beam towards the receiver, and b) the receiver comprises a photovoltaic cell having at least one junction which has a bandgap energy between 0.75 eV and 1.2 eV, and a detection unit adapted to detect the power of the laser beam impinging upon the receiver, independent of illumination of wavelengths outside the range of that of the laser beam; and c) the control unit is adapted to receive signals from the detection unit, and to interact with at least one of (i) the power of the beam emitted by the laser and (ii) a position of the scanning mirror.

The detection unit then generates a signal representing the power of the laser beam impinging upon the receiver, which is advantageously independent of illumination of wavelengths outside that of the laser beam.

The control unit can then use this signal to operate in two functionally distinct manners. In one implementations, the control unit uses the signal to control at least one of (i) the power of the beam and (ii) the position of the "scanning" mirror such that they are adjusted to provide optimum aimed output to the receiver. This is a conventional role for a control system, operating to positively control or "tune" the system to provide optimum power input at the ultimate target of the system, namely the receiver.

The term "scanning mirror" is used herein to indicate any movable mirror, which is intended to include a mirror rather fixed in position or moving slowly to aim the charging beam at a receiver and keep it aimed at it, rather than scan the surrounding, which is an alternative description of a differently functional "scanning" mirror.

According to a second configuration, the control system can also operate as a safety verifying system, to ensure that the laser power beam is not being diverted to an unintended direction, where it may cause damage. The system provides warning of a situation in which the laser beam is supposedly directing a beam of a certain power at a receiver, and yet the receiver is not receiving all or any of that power, indicating that at least part of the beam power is being diverted into a non-intended direction. This is achieved by using the control system in the reverse role to that which a control system usually operates, namely for verification of the system status rather than control of the system. In this mode, the control system inputs data from the laser relating to the output power that the laser is being instructed to provide, or is actually providing as indicated by a measurement at the transmitter, and inputs data from the scanning mirror relating to the direction in which that beam is being aimed. These data can then be combined in the controller and compared with the signal generated in the detector unit relating to the actual laser power received there. Any deviation greater than a predetermined margin of error or loss, between the expected laser power from these two sets of data, can be used to trigger a safety warning status regarding a wayward beam transmission, or the presence of an obstacle in the beam path reducing or diverting the intended beam.

Cover Layer

A cover layer may be advantageously applied onto the conductors, the cover layer having a high index of refraction, typically above 1.5, preferably above 1.6 or 1.65 or even a semiconductor coating layer with index above 2, but certainly more than 1.3.

In one implementation, the cover layer consists of a polymeric or dielectric layer covered by a glass layer. The cover layer is an optical layer that may be of uniform constitution, but typically has a top volume and a bottom volume, and may consist of many different transparent or semitransparent layers and has the following properties.

The top volume of the optical cover layer is in contact with the surrounding environment, typically air, but may also be in contact with other materials. The top volume is often a hard glass layer, which is more protective than the softer inner volume of the cover layer. Additionally, the top volume may be selected to have a higher refractive index than the main volume, in order to increase the probability of an internal ray undergoing total internal reflection. The bottom of the optical cover layer is in contact with both the surface of the PV, which typically includes an AR coating, and with the conductors described above. The cover layer should be as transparent as possible to the incoming beam wavelength, needing an optical density of less than 2 for the beam's wavelength, and with an optical density of less than 1 or even 0.5 preferred. Some materials may even allow optical densities of less than 0.1 or even less than 0.01, however at the same time, the cover layer should be configured to block, absorb, or reflect most of the other wavelengths except for the beam's wavelength in order to prevent other wavelengths that may come from sunlight, or other illumination sources, from reaching the p-n junction(s). Hence it should have an optical density of at least 0.5 for these wavelengths. The top of the PV is usually coated with an AR coating, the AR coating being typically, in prior art PVs, adapted to minimize the reflection between air (refractive index ~1) and the PV (typical refractive index 2-4).

In the case of the cells of the current disclosure, the bottom AR coating should be designed to minimize the reflection of the laser wavelength between the PV (index 2-4) and the optical cover layer (index 1.5-2) for the beam's wavelength while at the same time reflect shorter and longer wavelengths away from the cell. Both AR coatings may be used to reject unwanted wavelengths. The top of the cover layer may be coated with an AR coating adapted to minimize the reflection of the beam between air (refractive index ~1) and the top of the cover layer, while increasing the reflection of other wavelengths.

The cover layer "shields" the PN junction from light that is not the laser beam itself, this is crucial for safety and aiming measurements accuracy. This may be achieved by absorbing such unwanted light or by reflecting it away from the PV cell. As described above, the AR coating of the cover layer would reflect extraneous illumination outside of the laser band and the cover layer would further absorb any which is not reflected. In many cases the PN junction would be inefficient for very long wavelengths, eliminating the need to block such wavelengths.

The Overall Structure of the Grid Itself

The density of the grid lines should be chosen, depending on various parameters as will be explained below.

It is advantageous if the spacing between grid lines is more than the operating wavelength divided by 2*the refractive index of the cover layer:

$$d > \lambda/2n$$

where d is the space between conductor lines, $\lambda$ is the operating wavelength in Vacuum, and n is the cover layer refractive index.

It is also advantageous if the spacing between grid lines is less than 100 times the operating wavelength in vacuum $$d < 100\lambda$$

It is also preferable if the optical cover layer is chosen so that it has minimal absorption for the working wavelength but does absorb shorter wavelengths.

Should conductors be coated with diffusive coating, then the above dimensional constraints can be relieved.

Explanation of the Physics

When light is reflected from the grid of a prior art photovoltaic cell, it is usually unrecoverable, as it is reflected at an unknown angle, and construction of a collection system for the light that would not obstruct the incoming beam is difficult, if not impossible. At the same time, when a prior art photovoltaic cell is placed in direct sunlight, it will convert the 100 mW/cm$^2$ of sunlight into electrical power, making the laser power readings inaccurate, which may affect safety and aiming.

The photovoltaic cells of the present disclosure, utilize four separate design features which overcome many of the above described disadvantages of prior art PV cells.

1. The incoming beam hits the conductor in a reduced field of view due to the high refractive index of the cover layer used. In accordance with Snell's law, the beam angle is reduced by $\sin(\theta1)=n1/n2*\sin(\theta2)$, and therefore light reflected at an angle greater than the maximal field of view inside the cover layer, can be manipulated and reflected back towards the cell without blocking the field of view.
2. The grid structure serves to increase the amount of light being reflected outside the field of view of the incoming beams, by its dense grid lines and by the structure of each conductor.
3. The cover layer serves as the collection and reflection system, as most of the beam undergoes total internal reflection by the cover layer and is reflected back towards the photovoltaic cell.
4. Sunlight would be absorbed/reflected by the cover layer and its associated AR coating, and would therefore not influence the power measurements.

Use of the cover layer, and the above described features allows for reduced optical losses for the laser beam. The device can be further improved as the ability to recycle some of the light allows for increasing the coverage area of the conductors and therefore decrease the Ohmic losses, and for increase of the fill factor of the cell as well as the maximum power point voltage and current.

In order to facilitate efficient reflection towards the photovoltaic cell, the thickness of the cover layer should be less than the width of the photovoltaic cell. If it is thicker, light will escape from the sides of the cover layer.

All the above design features allow building a grid which has more "shading" compared to the normal shading described in the prior art.

The shape of a single conductor line should be chosen to maximize the high order reflections from the grid, typically as explained above.

The top volume should have an AR coating for air, or for the expected surrounding material, such as water or a vacuum.

Advantages when Illuminating the Cell with an Infrared Laser

The currently described features are especially useful for photovoltaic cells designed for converting infrared lasers into electrical energy because of a few advantages provided by such cells.

Firstly, such cells are typically illuminated with from 10 to 100 times the power per unit area, compared to one-sun conditions which conventional solar cells are typically exposed to. In comparison to CPV cells, the current design has a large field of view, and has deliberately reduced efficiency for sunlight.

Secondly, the infrared laser dictates lower energy photons, which require a lower bandgap in the p-n junction, which generates lower voltage and higher current compared to regular, solar spectrum optimized cells. Since the current is higher, the ohmic losses are more significant.

The p-n junction in such cells is tuned, by selecting a material which has a sufficiently low bandgap, to "ignore" long wavelength photons, longer than that of the laser beam, so that if the receiver is placed near a heat source such as a heating element or an incandescent lamp, output parameters such as power, current, voltage will be far less influenced by the long wavelength infrared photons.

Thirdly, unlike solar radiation, which is typically uniform across the area of the cell, laser radiation tends to form concentrated spots and "underfill" the cells. Laser beams generally have approximately round, elliptic or rectangular shapes with decaying power profiles of Gaussian or high order Gaussian, in many cases. A non-uniform power profile, makes optimization of conductor thickness more complex, and a power profile centered on the PV by the scanning mirror, typically means that electrons generated in the center of the cell, where most of the optical power is concentrated, generate a higher current and therefore require conductors with greater thickness and thus lower resistance, compared to conductors required for photons absorbed near the edges of the cell, where less optical power exists.

Fourthly, a specular reflection from the cell of a high power laser may pose a safety concern, and would need either blocking or diffusing. In any event, the reflection from the cells of the present disclosure, is of lower power, reducing safety concerns significantly.

Advantages when Illuminating the Cell Using a Wireless Power Beaming System

The current cell has many advantages when used as a component in a wireless power system. Typically, such a system may power a portable electronic device, equipped with a battery having capacity of 1-100 Watt Hour. Typically, the required charging power is in the order of 0.5-10 W, which calls for 1-30 W of charging beam to be used.

The typical diameter of the beam is a few mm, smaller beams are difficult to keep focused at 1-10 m range, hence a non-diffused reflection of 2-10% of the beam would carry a significant risk (20 mW-1 W). It is therefore essential to reduce the total amount of light reflected by the conductors and at the same time diffuse it. It is also essential to reduce the reflection from the cell; the current cells provide typically up to 1% reflection instead of the usual 2-10%.

There is thus provided in accordance with an exemplary implementation of the devices described in this disclosure a power converting device for converting optical power into electrical power adapted for optical wireless power transmission using a laser beam, the power converting device comprising:

(i) a photovoltaic cell having a plurality of conductors on a surface adapted to receive the laser beam, the photovoltaic cell having at least one junction having a bandgap energy between 0.75 eV and 1.2 eV, and (ii) a cover layer disposed upon the photovoltaic cell, the cover layer comprising a material adapted to restrict transmission, by either absorption or reflection, of illumination having wavelengths outside of the range of the wavelength of the laser beam, and to transmit the laser beam towards the photovoltaic cell, wherein:
   the laser beam has a wavelength between 700 nm and 1500 nm,
   the wavelengths of the illumination outside of the range of the wavelength of the laser beam fall within the range of 550 nm to 700 nm, and
   the transmission of the cover layer for the wavelength of the laser beam is at least 50% higher than its transmission for wavelengths within the range of 550 nm to 700 nm, such that the power converting device has an efficiency of conversion to electrical power at the wavelength of the laser beam at least 2.5 times higher than its efficiency at a wavelength of 550 nm.

In such a power converting device, the bandgap energy may be tuned to the wavelength of the laser such that the efficiency of conversion of optical power into electrical power for any wavelength longer by at least 25% than the wavelength of the laser, is more than four times less than the efficiency of conversion at the laser wavelength. In either rof the above described devices, the cover layer may further comprise at least one of:

(i) a first anti-reflective coating disposed upon the surface of the cover layer remote from the photovoltaic cell, the first anti-reflective coating adapted to reflect illumination having wavelengths outside of the range of the wavelength of the laser beam, and to transmit the laser beam into the cover layer, or (ii) a second anti-reflective coating disposed between the surface of the photovoltaic cell and the cover layer, the second anti-reflective coating adapted to reflect illumination having wavelengths outside of the range of the wavelength of the laser beam, and to transmit the laser beam into the photovoltaic cell.

A yet further implementation described in this disclosure is for a safety system for a wireless optical power transmission system comprising a transmitter, a receiver and a control unit, wherein:

(i) the transmitter comprises:
   a laser adapted to emit a beam, and
   a scanning mirror adapted for steering the beam towards the receiver, (ii) the receiver comprises:
   a photovoltaic cell having a plurality of conductors on a surface adapted to receive the laser beam, the photovoltaic cell having at least one junction having a bandgap energy between 0.75 eV and 1.2 eV, and
   a cover layer disposed upon the photovoltaic cell, the cover layer comprising a material adapted to restrict by either absorption or reflection, illumination having wavelengths outside of the range of the wavelength of the laser beam, and to transmit the laser beam towards the photovoltaic cell, and (iii) the control unit is adapted to receive first data representing the position of the scanning mirror, and to receive second data from the transmitter representing the power of the beam emitted by the laser, and to determine from the first and second data, the expected power incident on the photovoltaic cell, and to compare the expected power with the power of the laser beam impinging upon the receiver, as measured by the photovoltaic cell, and to indicate a potential safety problem if the expected power deviates from the measured power by more than a predetermined level.

According to even another embodiment of the present application, there is provided a wireless optical power transmission system comprising a transmitter and receiver, the transmitter comprising:
  a laser adapted to emit a beam,
  a scanning mirror adapted for steering the beam towards the receiver, and
  a control unit adapted to receive signals from a detection unit on the receiver, and to control at least one of (i) the power of the beam emitted by the laser and (ii) a position of the scanning mirror; and
the receiver comprising:
  a photovoltaic cell having a plurality of conductors on a surface adapted to receive the laser beam, the photovoltaic cell having at least one junction having a bandgap energy between 0.75 eV and 1.2 eV, the photovoltaic cell adapted to detect the power of the laser beam reaching the photovoltaic cell, wherein:
  the receiver comprises a cover layer disposed upon the photovoltaic cell, the cover layer comprising a material adapted to absorb or reflect illumination having wavelengths outside of the range of the wavelength of the laser beam, and to transmit the laser beam towards the photovoltaic cell, and at least one of:
    (i) a first anti-reflective coating disposed upon the surface of the cover layer remote from the photovoltaic cell, the first anti-reflective coating adapted to reflect illumination having wavelengths outside of the range of the wavelength of the laser beam, and to transmit the laser beam into the cover layer, and
    (ii) a second anti-reflective coating disposed between the surface of the photovoltaic cell and the cover layer, the second anti-reflective coating adapted to reflect illumination having wavelengths outside of the range of the wavelength of the laser beam, and to transmit the laser beam into the photovoltaic cell,
  wherein, the detection unit generates a signal representing the power of the laser beam impinging upon the receiver, independent of illuminations of other wavelengths other than that of the laser beam, and the control unit is adapted to control at least one of (i) the beam and (ii) the position of the scanning mirror in order to maintain the power impinging on the receiver.

An even further power converting device for converting optical power into electrical power adapted for optical wireless power transmission using a laser beam, described in this disclosure, may comprise:
  a power converting device having at least one junction having a bandgap energy between 0.75 eV and 1.2 eV, and having an external layer through which laser light is transmitted towards the at least one junction, the external layer being configured to transmit at least a first wavelength into the at least one junction with at least 80% efficiency when illuminated through the external layer from any direction between ±20° to the normal to the surface of the external layer, wherein at least one of:

(i) the conversion efficiency of the power converting device for the first wavelength being at least 30%, the first wavelength being a near infra-red wavelength between 700 nm and 1500 nm,
(ii) the power converting device external layer being configured to reflect or absorb a portion of incident illumination at a second wavelength between 550 nm and 700 nm, so that less than 60% of the illumination at the second wavelength reaches the at least one junction when illuminated through the external layers from any direction between ±20° to the normal to the surface of the external layer(s) and the power converting device conversion efficiency for the second wavelength is at below 20%,
(iii) the power converting device external layer being configured to absorb or reflect at least a third wavelength between 300 nm and 550 nm, so that at least 50% of the power of the third wavelength is absorbed before reaching the at least one junction, when illuminated through the external layer from any direction between ±20° to the normal to the surface of the external layer, and the power converting device conversion efficiency for the third wavelength being less than 10%, and
(iv) the power converting device conversion efficiency for a fourth wavelength between 1500 nm and 2000 nm being below 5%.

Yet another embodiment of the power converting devices for converting optical power beam to electrical power, as described in this disclosure, may comprise:
(i) a semiconductor device having a p-n junction adapted to absorb the optical power beam,
(ii) top and bottom conductors in electrical contact with the semiconductor device, the top conductor covering a portion of a top surface of the semiconductor device, and
(iii) an optical layer disposed on the top surface of the semiconductor device, the optical layer comprising a top volume and a bottom volume, the bottom volume being in optical contact with the top surface of the semiconductor device, and with the top conductor of the semiconductor device, and the top volume being in optical contact with air, wherein:
(a) the top conductor is adapted to reflect at least 30% of the light impinging upon it,
(b) the optical layer has an optical density for the optical power beam of less than 2, and
(c) the top conductor is adapted to direct at least 25% of the light reflected by it into angles greater than $\sin^{-1}(1/\text{the refractive index of the bottom volume})$ In such a power converting devices, at least a portion of the light reflected by the conductors may be reflected at angles which undergo total internal reflection from the top surface of the top volume. The top volume of the optical layer itself may be an anti-reflective coating adapted to reduce the reflections of the optical power beam coming from a medium having a refractive index of approximately 1. The top volume of the optical layer may further be a scratch resistive coating. If an anti-reflection coating, it may further be adapted to reduce reflections of the optical power beam over angles between at least −10 degrees and +10 degrees to the normal to the top surface.

Additionally, in any of the above described power converting devices, the portion of coverage of the top surface covered by the top conductor may be at least 4%. The conductors themselves may be made of metal, and could comprise at least partially aluminum, gold, silver or copper.

Furthermore, in the above described power converting devices, the area of the geometric projection of the portions of the conductors aligned at an angle of at least $\sin^{-1}(1/\text{the}$ refractive index of the bottom volume) onto the top surface of the semiconductor device may be at least 25% of the area of the semiconductor device multiplied by the portion of coverage of the top surface covered by the top conductor.

According to yet further implementations of such power converting devices, the laser reflection from the power converting device may be diffused. In such a case, the diffused reflection from the power converting device may have an angular subtence of at least 1.5 millirad. Furthermore, the area of the semiconductor device measured in meter$^2$ times the bandgap of the junction, measured in Joules squared, times the designed maximal electrical power of the cell, measured in watts to the third power, is less than $214*10^{-30}$, such that $P^3*(bandgap)^2 A < 214*10^{-30}$ In any of the above described power converting devices, the top conductor may comprise a conducting grid having a finger-shaped profile, or a triangular shaped profile.

Finally, there is also provided, according to a yet further implementation described in this disclosure, a power converting device for converting optical power into electrical power adapted for optical wireless power transmission using a laser beam, the power converting device comprising:

a photovoltaic cell having a plurality of conductors on a surface adapted to receive the laser beam, the photovoltaic cell having at least one junction having a bandgap energy between 0.75 eV and 1.2 eV, and having a cover layer disposed upon it, wherein:

the cover layer comprises a material adapted to at least one of absorb or reflect illumination having wavelengths within the range of 550 nm to 700 nm, and to transmit the laser beam towards the photovoltaic cell, and the laser beam having a wavelength between 700 nm and 1500 nm, and the transmission of the cover layer for the wavelength of the laser beam being at least 50% higher than its transmission for wavelengths within the range of 550 nm to 700 nm, such that the power converting device has an efficiency of conversion to electrical power at the wavelength of the laser beam at least 2.5 times greater than its efficiency at a wavelength of 550 nm.

BRIEF DESCRIPTION OF THE DRAWINGS

The present invention will be understood and appreciated more fully from the following detailed description, taken in conjunction with the drawings in which.

DETAILED DESCRIPTION

Figure 1:
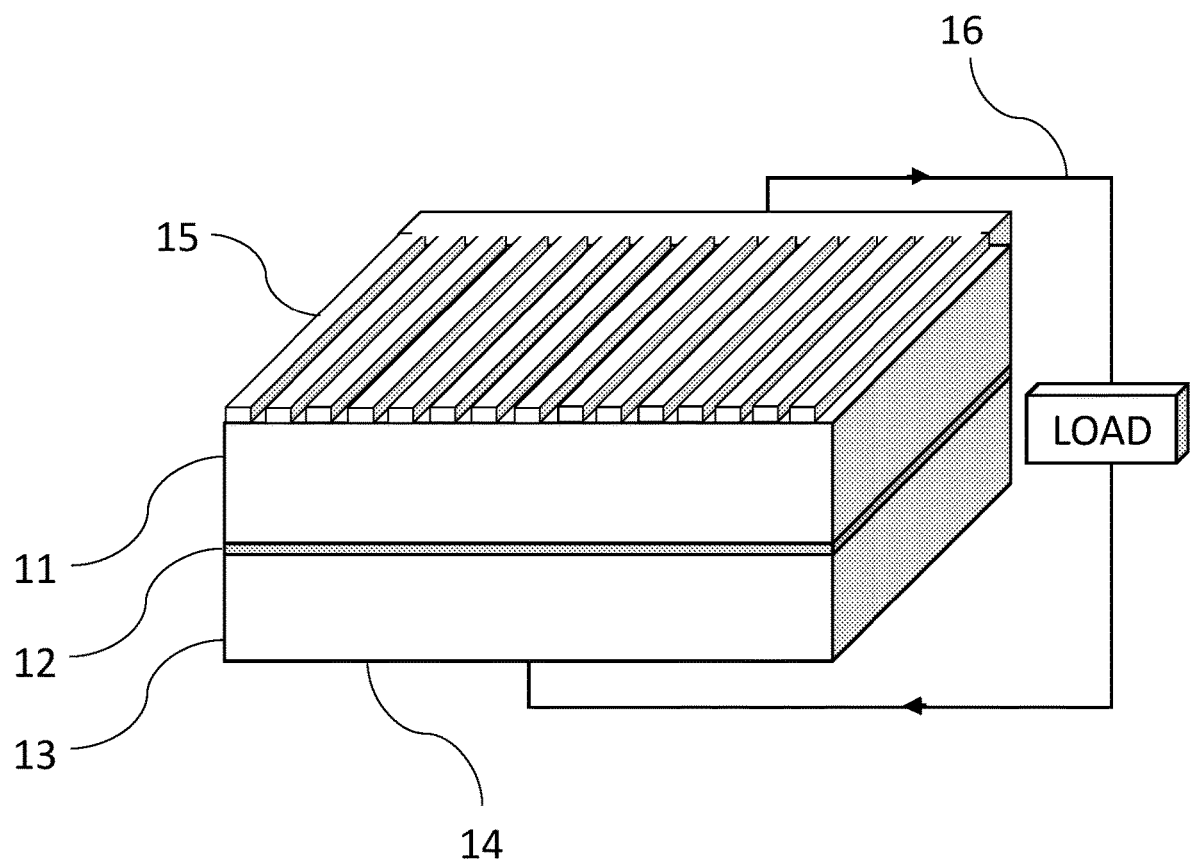
FIG. 1 shows schematically a typical structure of a prior art photovoltaic cell.

Reference is now made to FIG. 1, which shows schematically a typical structure of a photovoltaic cell, made from p-type semiconductor 13 attached, or sometimes in close proximity but still separated by another layer, to n-type semiconductor 11, forming a p-n junction 12. A full metallic contact is positioned on the back of the cell 14 and a partial metallic contact in the form of a grid (or similar structure) 15 is positioned on the front of the cell allowing light to penetrate through the spaces between conductors. Incident illumination generates a current 16 through the load.

Figure 2:
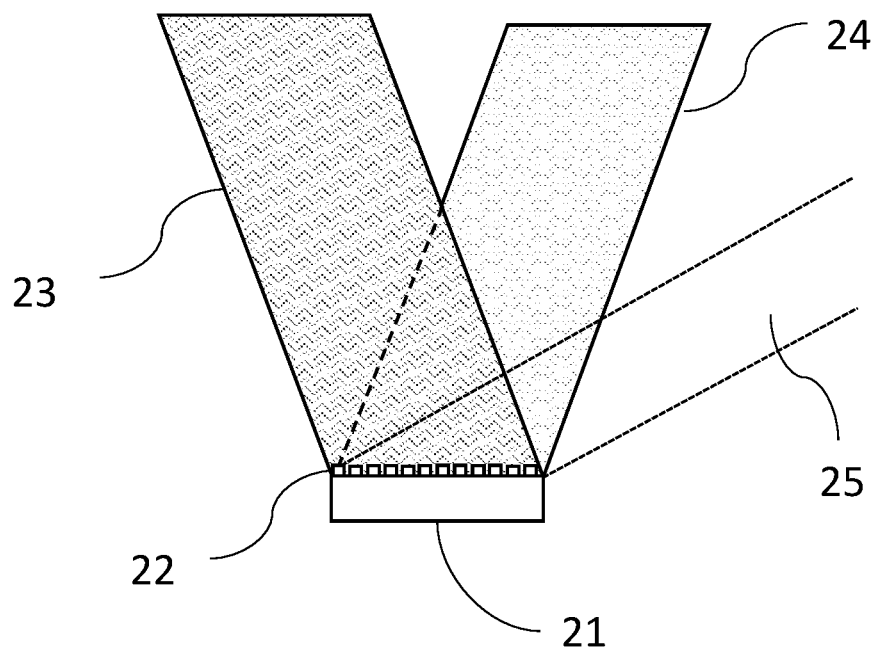
FIG. 2 shows schematically the first two orders of Bragg reflection of an incident beam on a prior art rectangular grid photovoltaic cell of the type shown in FIG. 1.

Reference is now made to FIG. 2, which shows schematically the first two orders of Bragg reflection of an incident beam 23 on a prior art rectangular grid photovoltaic cell 21. An incoming beam 23 impinging on the metal grid 22 of photovoltaic cell 21, some 2-10% of the power in beam 21 is reflected by conductor grid 22 in a Bragg pattern including several orders such as zero order 24 and 1st order 25 shown in FIG. 2.

Figure 3:
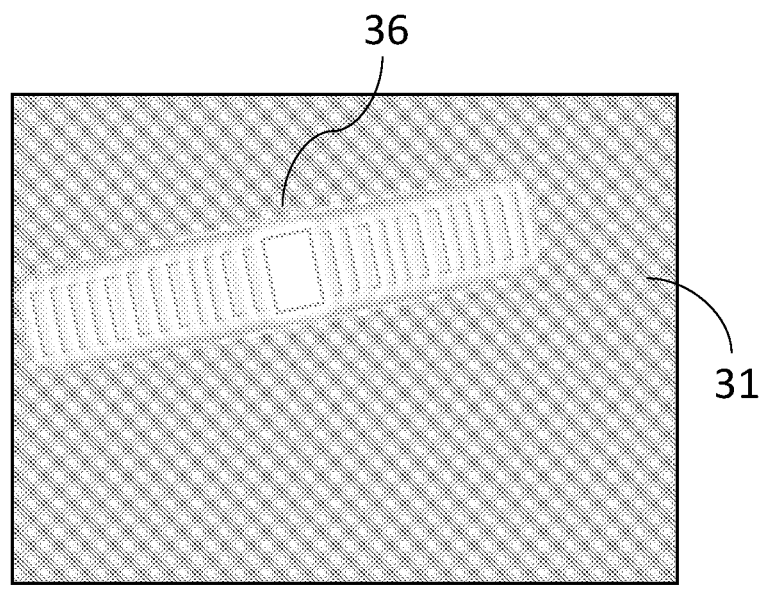
FIG. 3 shows a representation of a typical multiple order reflection from the surface of a photovoltaic cell, with at least 20 orders of reflection being visible.

Reference is now made to FIG. 3 which shows a representation of such a typical multiple order reflection 31 from the surface 32 of a prior art photovoltaic cell, with at least 20 orders of reflection being visible. The power in each "order" is very much dependent on the angle of illumination, causing safety and aiming problems. The total reflection spans some 5 degrees from the zero order reflection and the zero order reflection is the strongest reflection. Higher orders of reflection include much less power compered to lower orders. This is unlike the current cells, which prefer reflection into higher order modes, specifically above the critical angle of the optical cover layer.

Figure 4A:
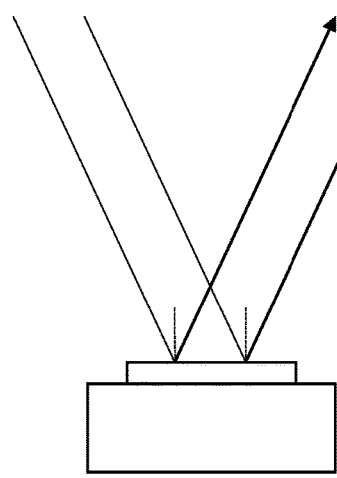
FIGS. 4A, 4B, and 4C illustrate schematically alternative grid profiles used in PV cells, and a schematic representation of the reflective beam patterns generated by each profile.
Figure 4B:
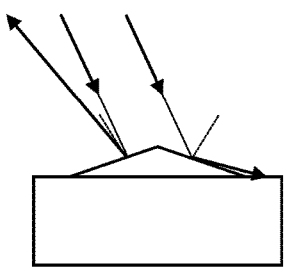
Figure 4C:
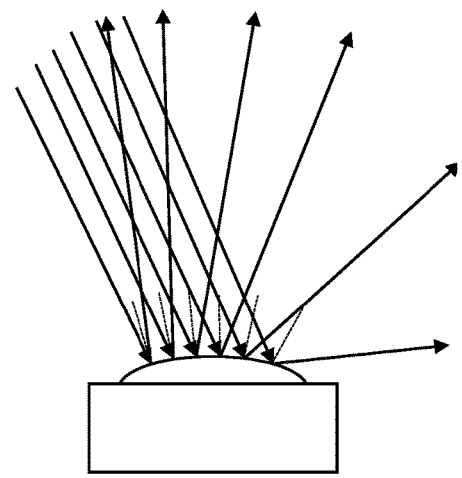

Reference is now made to FIGS. 4A, 4B and 4C, which illustrate schematically alternative grid profiles used in PV cells. FIG. 4A shows the reflection from a grid of rectangular conductors, the reflection being generated at an angle opposite to the incoming beam angle. FIG. 4B shows a reflectance from a triangular reflector, which divides the beam into 2 wide angle beams and works well for small fields of view (FOV). FIG. 4C shows the reflection from a rounded conductor which is spread over a wide angle. A preferred implementation (not shown in FIGS. 4A to 4C) is a conductor covered with a diffusive top layer, which may spread the radiation in a very wide pattern.

The structures shown in FIG. 4B and FIG. 4C as well as the diffusive coating on the conductors enhance the high order reflections from the grid and therefore enhance the "recycling" of the reflected light. It is to be understood that perfect geometrical shapes are typically impossible to manufacture, and such illustration serves as a simplistic example. It is preferred to choose a pattern that will spread the light over a wide FOV such as a diffusive, round or triangular shape. Shapes which reflect a significant percentage of the light into wide angles are preferred, such as triangles with reflector incline greater than a threshold angle. The conductors are typically made of reflective materials such as metals, reflecting at least 30% of the light falling on them, typically a material reflecting at least 90% of the light is chosen, such as aluminum, silver or gold. The conductors may be coated with a diffusive coating.

Figure 5:
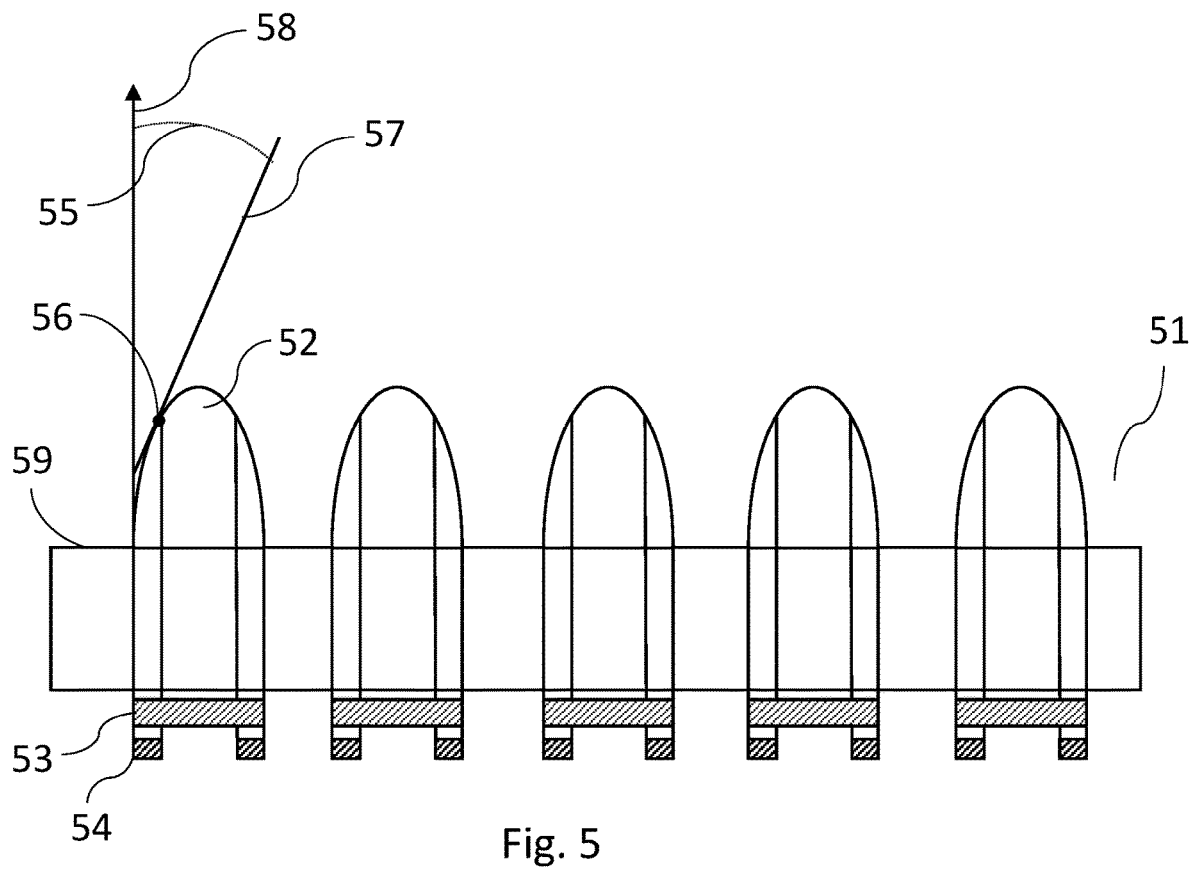
FIG. 5 illustrates the features of a photovoltaic cell relevant for the present disclosure, illustrating the terms used.

Reference is now made to FIG. 5, which illustrates the terms used in the present disclosure. It shows the angular dependence of the reflected light as a function of the incident light for finger-shaped conductors on a PV 51, having a back electrode, and p-n junctions, besides the conductors 52. The angle 55 is the local angle formed by the intersection of a line 57 tangential to the surface of the finger conductor at a point 56 on the conductor, with the normal 58. The area projected onto the upper surface 59 of the PV by the conductors 52 is shown below the PV and is numbered 53. The area projected onto the PV surface by the part of the conductors 52 wherein the angle is less than a threshold is shown below the PV and is numbered 54.

Figure 6A:
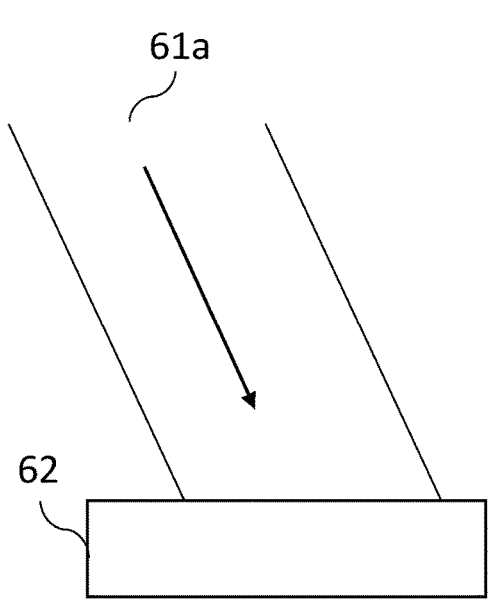
FIGS. 6A and 6B show the effect of a high index cover layer on the incidence of the incoming beam angle impinging on a photovoltaic cell.
Figure 6B:
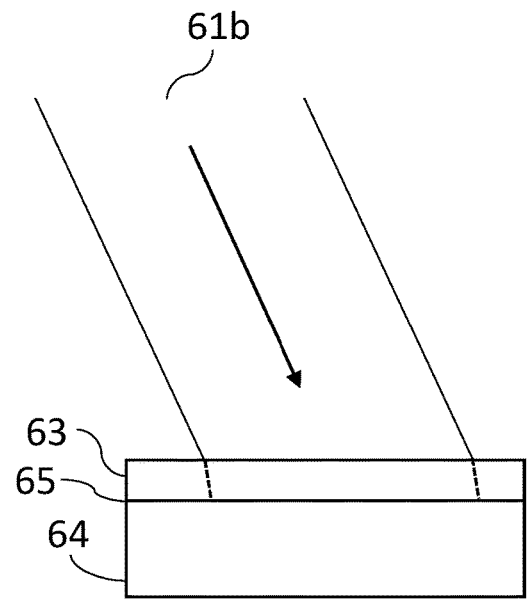

Reference is now made to FIGS. 6A and 6B, which illustrate the difference between the incoming beam angle 61a of a known PV cell 62 without a high index cover layer, and incoming beam angle 61b of a cell 64 with a high index cover layer 63, as proposed in the current application. Each is illuminated by a beam of light, either beam 61a in FIG. 6A, or beam 61b in FIG. 6B. Beam 61b passes through the cover layer 63, which is a transparent coating layer, and is referred to as the optical cover layer. The top of optical cover layer 63 may be anti-reflective coated to reduce the reflection of beam 61b and allow most of it to enter optical cover layer 63. The bottom surface 65 of optical cover layer 63 is in contact with both the top of the PN junction of cell 64 as well as with the conductors (not shown) on the cell 64. There is an anti-reflective coating between the bottom 65 of optical cover layer 63 and cell 64, which is adapted to reduce the reflection of light beam 61b when traversing from the refractive index of the bottom part 65 of optical cover layer 63 to the top part of cell 64. Optical cover layer 63 is typically of high index, preferably has an optical density that allows at least 80% of the power to transit through it, and has an optical density<2 when measured against optical beam 61b. Optical beam 61b reaches the top surface of cell 64 at a reduced angle of incidence compared to the angle at which beam 61a, which is parallel to 61b, hits cell 62, due to the high index of coating layer 63. The thickness of coating layer 63 should be less than the width of cell 64.

Figure 7A:
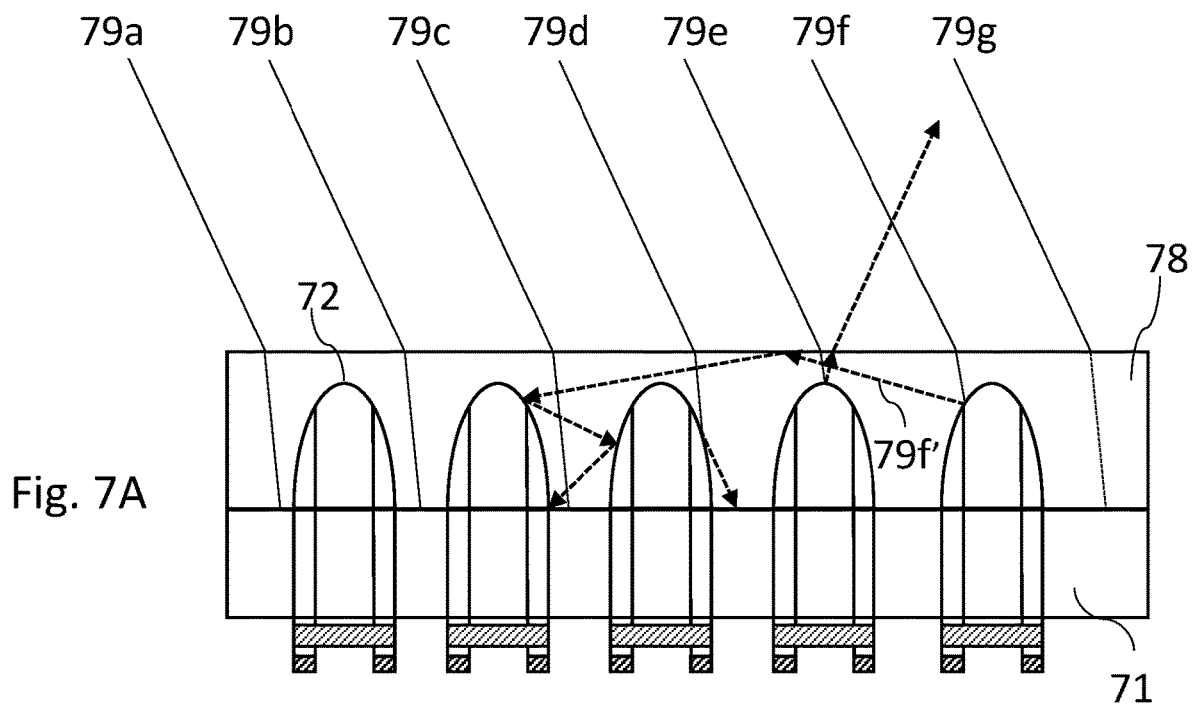
FIG. 7A shows the effect of a cover layer and the shape of the conductor fingers on representative rays of light impinging upon a photovoltaic cell according to the present disclosure.

Reference is now made to FIG. 7A, which shows a photovoltaic cell 71, similar to that shown above in FIG. 5 with the addition of the cover layer 78. This drawing shows the different paths which incident beams can take when impinging on the PV structure. Beams 79a, 79b, 79c and 79g are shown absorbed by the cell 71 as they would be on a known PV cell with the same conductor coverage. Beam 79d, on the other hand, is shown reflected by the side of conductor 72, and is immediately absorbed by the cell 71. Beam 79e is shown reflected by the top of the conductor 72, and escaping from the device, in a similar manner to what would occur if it were to impinge on a prior art rectangular conductor. It is thus lost and not converted to electrical energy. Beam 79f is shown reflected off the conductor at an angle which, in a prior art PV cell, would have resulted in the beam being lost. However, because the current PV is covered by the cover layer 78, beam 79f now impinges on the inner side of the top surface of the cover layer 78 at an angle of incidence greater than the critical angle for that upper surface interface, and is thus reflected as beam 79f' back towards the PV surface, and, instead of being lost, is absorbed by the cell, even after additional reflections as typically illustrated in FIG. 7A. Optical conductors 72 are wider than similar conductors in a prior art cell and therefore have lower resistance and higher reflections compared with prior art conductors. The shape of optical conductors 72 is designed to maximize the projected area of the portions of the conductors which are tilted at an angle above 80% of the critical angle, as calculated based on the refractive index of the bottom part of optical cover layer 78. Reflection at such angles has a high probability of eventually reaching the cell again and being absorbed by it and converted to electrical power. Conductors 72 typically have reflectivity of greater than 80 to 90%, but in some cases they may be less reflective. Conductors 72 may be made of metals such as aluminum, silver, gold, molybdenum, copper, nickel, or tungsten, and may be coated with diffusive coating, such as opal coating. Alternately, the conductors may have small reflective structures or particles deposited on them. Conductors 72 are spaced so that the reflection from them is maximized to orders above the 80% of the critical angle as calculated based on the refractive index of the bottom part of optical cover layer 78. Such spacing is typically more than 0.5 wavelengths/refractive index and less than 100 wavelengths.

Figure 7B:
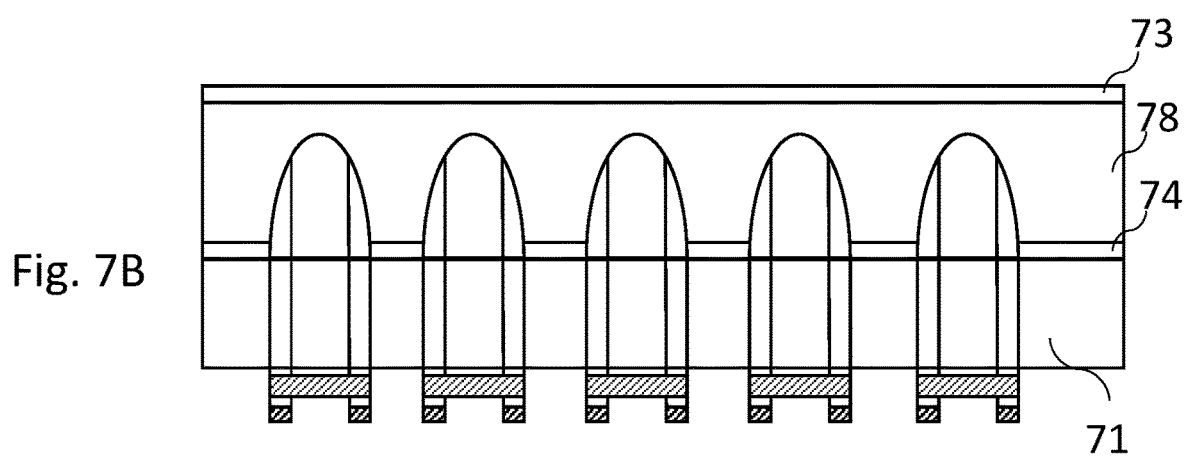
FIG. 7B shows an implementation of a photovoltaic cell according to the present disclosure, with the addition of anti-reflection coatings on either side of the cover layer.
Figure 8A:
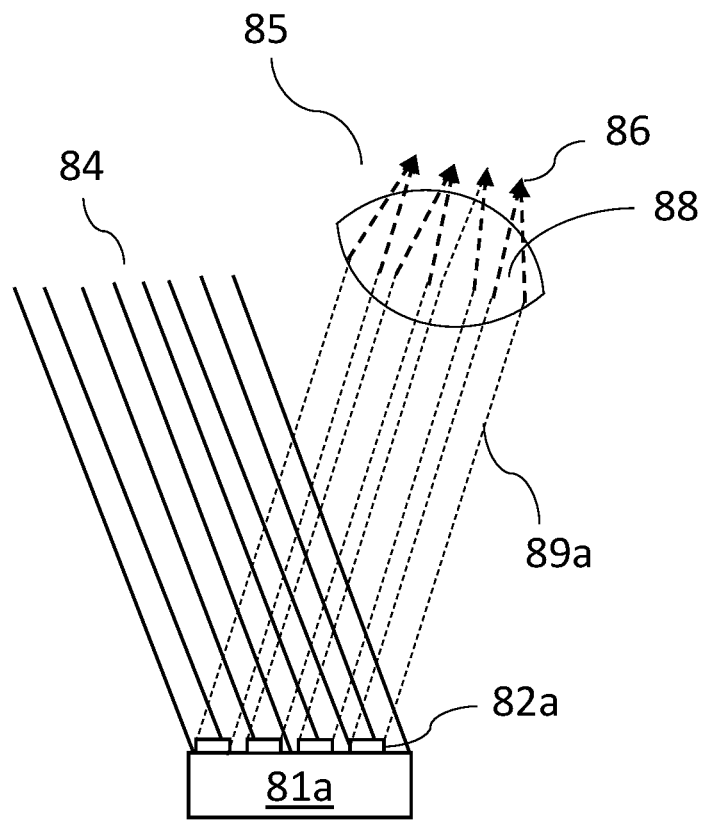
FIGS. 8A and 8B schematically show reflections from a photovoltaic cell and follow the path of a reflected collimated beam as it impinges on a human eye.
Figure 8B:
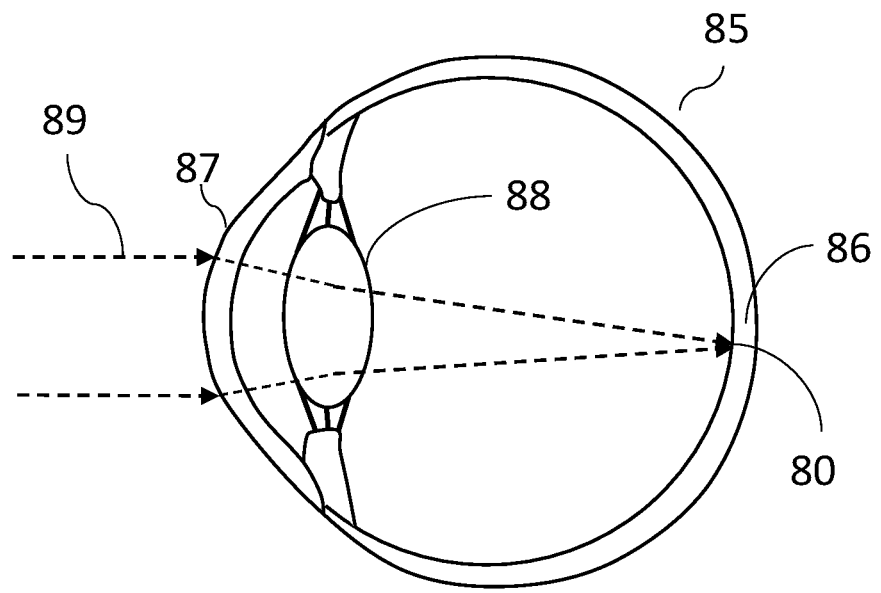
Figure 8C:
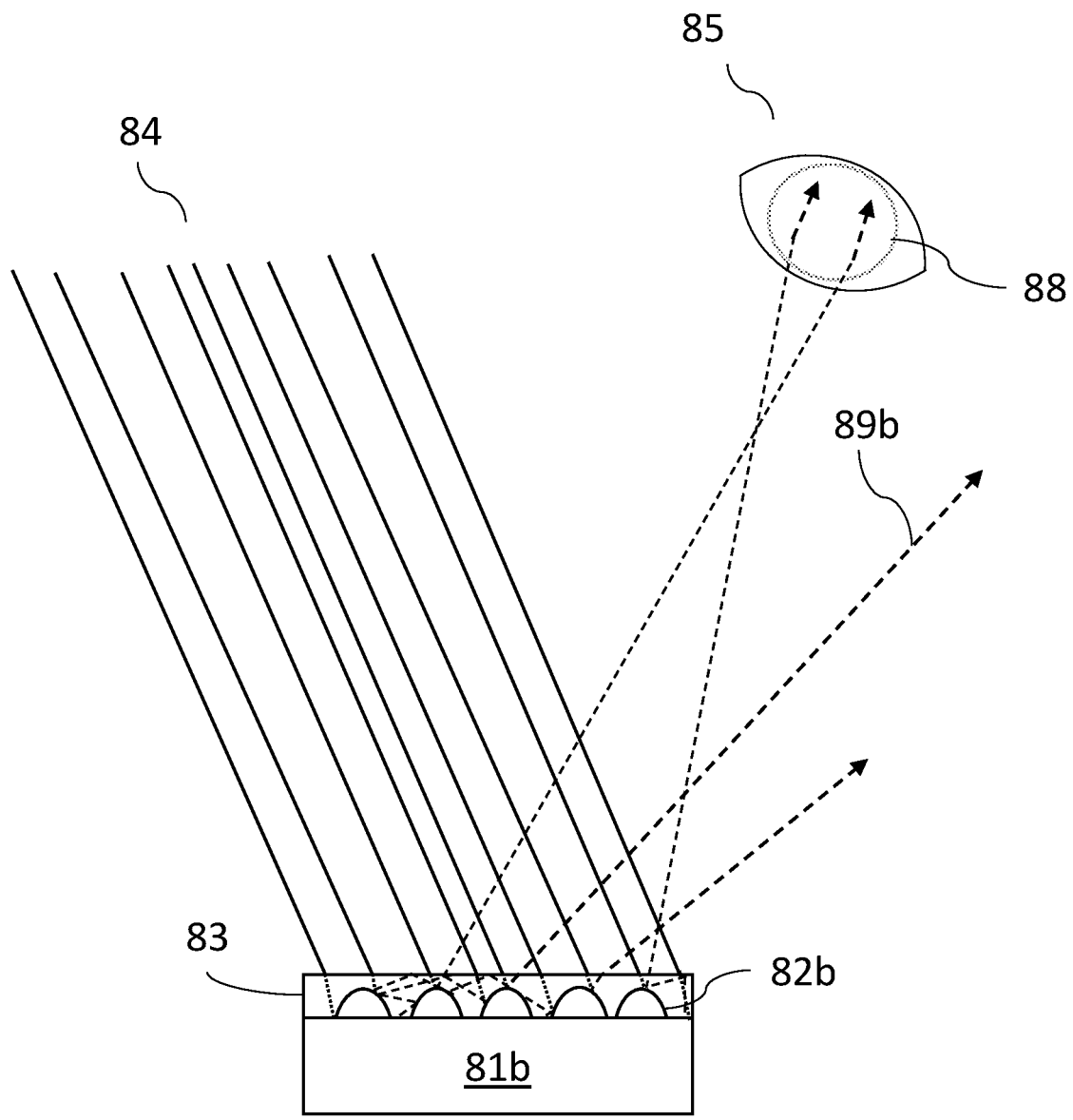
FIG. 8C schematizes the paths of a few representative, reflected diffuse beams that escape the cover layer of a photovoltaic cell in an embodiment of the present disclosure.

Although the conductors in FIG. 7A, and in previous FIG. 5 and subsequent FIGS. 7B and 8C are shown as finger shaped, it is to be understood that they could also have any other suitable profile to provide the multiple internal reflections of the beam within the cover layer 78, such as the triangular shape of FIG. 4B.

Reference is now made to FIG. 7B, which shows the PV cell of FIG. 7A, according to the present disclosure, with the addition of anti-reflection coatings 73, 74 on the upper and lower surfaces of the cover layer 78.

Figure 7C:
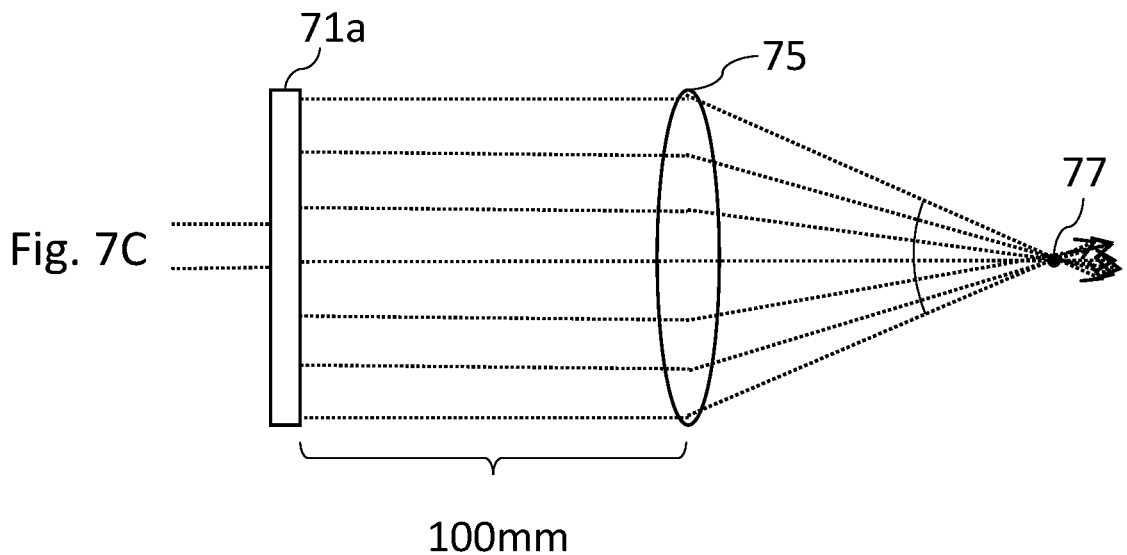
FIGS. 7C and 7D illustrate schematically the difference in angular subtence between a collimated light beam and a diffuse light beam impinging on the lens of an eye.

Reference is now made to FIG. 7C, which illustrates the significance of the angular subtence of an apparent source, this being the angle subtended by an apparent source as viewed from a point in space. Specifically, the resolution of the human eye is such that a typical retinal photoreceptor views an angular subtence of the surrounding environment of approximately 1.1 millirad. This calculation derives from the fact that a single retinal photoreceptor cell outer segment is ~25 micron in radius and the effective focal length of the human eye is ~17 millimeter in a water-based environment, equivalent to ~22 millimeter in air. A light source with an angular subtence of 1.1 millirad may be focused on a single retinal cell and the entire power from the source may thus be absorbed by the same cell. A light source with a smaller angular subtence would still be absorbed by a single photoreceptor. However, a source with higher angular subtence, resulting from poor optical quality, cannot be focused on a small spot. Thus, it would be impossible to focus such a source on a single biological cell, and as a result a source with higher angular subtence would pose lesser danger. In other words, a single retina cell occupies ~$4*10^{-6}$ steradians. The radiation from a diffused source having angular subtence of 1.5 steradians is expected to be distributed over at least 2 retinal cells and therefore carries approximately half of the retinal risks and is safer.

Referring now to the details of FIG. 7C, a PV 71*a* reflects a portion of the light illuminating it in a diffuse manner. Lens 75, positioned 100 mm from the surface of the window in front of PV 71*a*, converges the beam of light to a point of light 77 at the focal point of the lens. Should PV 71*a* reflect a high quality optical beam, similar to a $TEM_{00}$ laser, lens 75 will focus the light to a diffraction limited spot. The angle 70 subtending between the top of the image, the center of the lens, and the bottom of the image would be close to 0.

Figure 7D:
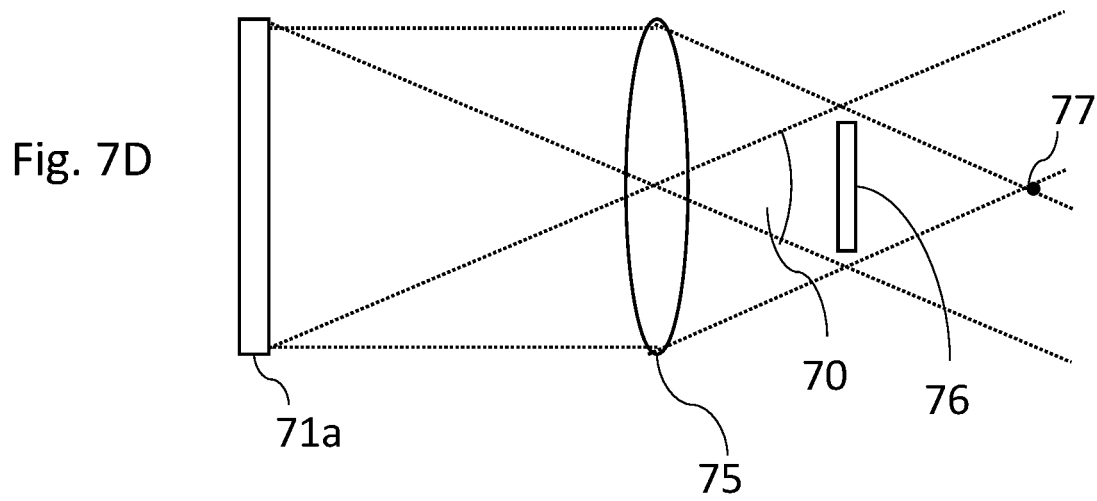

Another possible scenario is shown in FIG. 7D, where PV 71*a* is reflecting diffusively image instead of preserving the optical quality of the original laser beam. In such a case, lens 75 would not create a diffraction limited spot, but would rather create an image 76 of PV 71*a*, and the angle 70 would obviously be bigger.

Typically lens 75 is moved around, closer and farther from the PV cell, to locate the point of minimal angular subtence of the beam to determine the angular subtence of the beam at a certain distance.

On top of the above requirements, it is important that the PV would be responsive to changes in illumination levels. The higher the beam power, the more responsive the photovoltaic cell must be in order to allow a safety system to be based on detecting the light levels. It has been found that for the PV to be responsive, the cell's structure must be adapted to match the intended power level according to the following formula:

$$10^{27} * (\text{bandgap})^2 \frac{A}{d} < \frac{214}{P^3}$$

where d is the thickness of the layer absorbing beam's photons in the photovoltaic cell measured in meters bandgap is the bandgap energy of the p-n junction measured in Joules A is the area of the photovoltaic cell measured in $Meter^2$. If too large a cell is used, then the responsiveness of the cell drops and it cannot react fast enough to changes in illumination levels.

Since d is usually less than 300 micron thick, and always less than 1000 micron thick, this can be simplified to $$10^{30} * (\text{bandgap})^2 A < \frac{214}{P^3}$$

Or in a more convenient form $$P^3 * (\text{bandgap})^2 A < 214 * 10^{-30}$$

Reference is now made to FIGS. 8A and 8B, in which FIG. 8A illustrates a reference PV cell 81*a* with known characteristics, and FIG. 8B shows the effect of reflected, collimated laser light on a human eye. In FIG. 8A, the light beam 84 illuminates the PV cell 81*a*, and while most of the light is absorbed by the cell 81*a*, some of the incident beam is reflected by the cell towards eye 85. The cell 81*a*, reflects typically some 2-10% of the light impinging upon it, mostly into the first order reflection, in which the light hitting a flat surface produces a mirror like reflection, the angle of incidence being equal to the angle of return. The reflected light is collected by the lens 88 of the human eye 85 and forms a few discrete small lines, these being an image of the conductors on the retina 86.

As shown in FIG. 8B, the cornea and lens may focus the strip of light 89 from the collimated beam to small point, with the potential to cause greater focal damage. As the reflection from a collimated beam would diverge minimally, and as the beam is refracted by both the cornea 87 and the lens 88, the result is a focusing of a powerful beam of light energy, as illustrated in FIG. 7C, that may converge onto sensitive ocular tissue. Such a focused beam has a significant potential to cause damage 80 at the point 80 where the beam impinges on the retina 86.

Reference is now made to FIG. 8C, schematically illustrating a PV cell 81*b* according to an implementation of the current disclosure. In contrast to PV cell 81*a*, PV cell 81*b* uses non-rectangular, highly convex profile conductors 82*b* and a cover layer 83. The cell 81*b* comprises conductors 82*b*, which reflect generally up to about 10% of the light, as the conductors are wider than a typical rectangular conductor, but since the conductors 82*b* reflect the beam at an angle, the majority of the first order reflections are above the total internal reflection angle of the optical cover layer and are thus reflected back towards the cell, where approximately 90% of it is absorbed. About 0.04%-2% of the original beam is reflected a second time by the conductors and these rays 89*b* may be reflected outside the optical cover layer 83, but are now reflected in a diffused manner. Eye lens 88 collects a small amount of the diffuse emitted light 89*b* and may form an image of the cell 81*b* on the retina. However, that image has significantly less power per unit area, and therefore poses a significantly smaller risk to the retina. The highest collection of light by the eye would be at the smallest distance. Since the minimal focal distance of the human eye is ~100-150 mm, the riskiest collection position would be at approximately 100-150 mm distance from the cell.

Comparing the reflected light from a reference PV cell in FIG. 8A with an implementation of the present disclosure schematically depicted in FIG. 8C, beam 84 approaches cell 81*b* from the same angle as it was shown impinging on cell 81*a*. By contrast, in FIG. 8C, the beam traverses cover layer 83 before being reflected by conductors 82*b* in angles above 80% of the critical angle, as calculated based on the reflective index of the bottom of cover layer 83. The rays that reflect are absorbed by the cell 81*b* at a higher efficiency compared with cell 81*a*, and the percentage of beams eventually emitted through the top of optical cover layer 83 is lower compared to the percentage reflected by conductors 82*a*. Further, the rays 89*b* that are emitted from the top of optical cover layer 83 are diffuse, each emitted in a different direction. Therefore, the power of light impinging on the eye 85 in FIG. 8C is lower compared to the power of light collected by the eye 85 in FIG. 8A. In FIG. 8C, because the rays are not traveling in the same direction, they will not converge on the same position, and they thus form a diffuse image on the retina of the eye 85, as illustrated in FIG. 7D, that poses a much lower risk to the retina.

The currently described devices typically allow for a cell of 1 cm by 1 cm size, to reflect diffused back-reflection, such that the reflection from the conductors of the beam of a $TEM_{00}$ laser would form a minimal image when focused by a f=25 mm lens placed 100 mm from the surface of the cell, subtending at its 1/e diameter, at least 1.5 mRad, and typically much more, therefore posing much less risk to the retina. Furthermore, by diffusing the beam, the current cell configuration allows for the typically center-weighted beam received from the laser source, to be less centered and more uniform. Improved uniformity of illumination thus allows for a more complete utilization of the cell by allowing current to flow from a shorter distance to the current collectors at the edge of the cell. The current cell also allows for thicker metal conducting fingers, which result in lower Ohmic losses, an advantageous feature in the case of a high optical flux, as is the case with most laser power converters.

Figure 9:
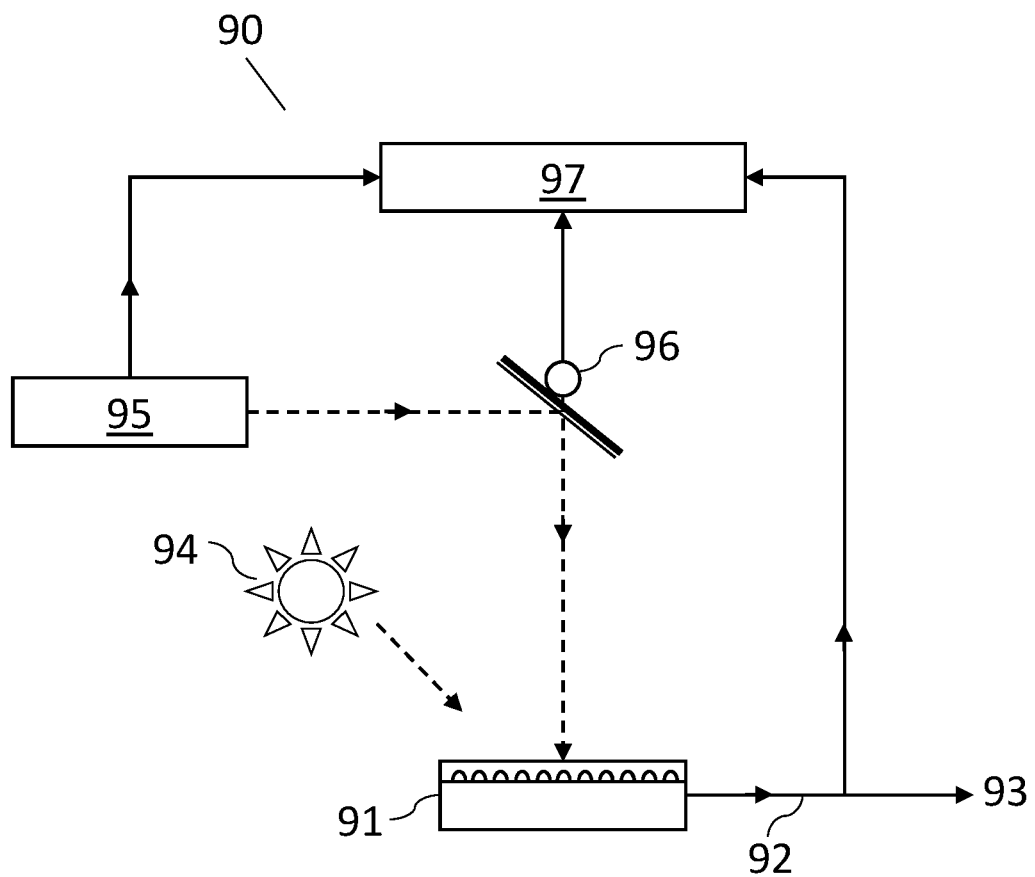
FIG. 9 shows a safety control system for providing a warning of a situation in which the laser beam is supposedly directing a beam of a certain power in the direction of a receiver, and yet the receiver is not receiving all or any of that power, indicating that the beam is being diverted into a non-intended direction.

Reference is now made to FIG. 9, which shows a safety control system 90 configured to provide a warning in case of a situation in which the transmitter 95, typically a laser, is supposedly directing a beam of a certain power in the direction of a receiver 91, and yet the receiver is not receiving all or any of that power, indicating that the beam is being diverted to a non-intended direction. The control system 90 provides an indication or warning that the transmitted laser beam may present a hazard to the surroundings, since it is not reaching its intended receiver, or is reaching the correct receiver but with excessively reduced power. The controller unit 97, which is most advantageously located in the transmitter 95, but could also be positioned elsewhere in the system, as shown in FIG. 9, or in the space being serviced by the transmitter, receives a signal input 92 from a detection unit 91 in the receiver, which is generally the PV cell in the receiver. The signal 92, which can be sampled from the electrical power output 93 from the PV cell, represents that portion of the power level falling on the PV cell, of illumination having the laser wavelength, even in situations in which significant levels of power from other sources, such as sunlight 94, may fall on the PV cell 91. The control unit 97 is configured to also receive signals from the laser power supply 95 in the transmitter, indicating the power of the laser beam emitted by the laser and from the position of the scanning mirror 96, both of the settings of these components of the system being determined by the operational requirements for supplying beamed laser power to the receiver. Should the laser power setting and the mirror scan position show that a certain power level is expected from the detector unit, and the actual input to the control unit shows a power level below that level expected by more than a predetermined amount, it is assumed that part of the beam is being obstructed, and is not reaching its intended receiver target, thus triggering a safety warning by the system.

It is to be understood that the control system can also operate in its conventional manner, i.e. in the reverse direction, in order to optimize the scanning mirror setting, to keep the laser beam centered on the receiver PV, and to control the laser to supply the intended laser power, according to the power measured by the detector unit.

It is appreciated by persons skilled in the art that the present invention is not limited by what has been particularly shown and described hereinabove. Rather the scope of the present invention includes both combinations and sub-combinations of various features described hereinabove as well as variations and modifications thereto which would occur to a person of skill in the art upon reading the above description and which are not in the prior art.

We claim:

1. A power converting device for converting optical power into electrical power adapted for optical wireless power transmission using a laser beam, said power converting device comprising:
   a photovoltaic cell having a plurality of conductors on a surface adapted to receive said laser beam, said photovoltaic cell having at least one junction having a bandgap energy between 0.75 eV and 1.2 eV; and
   a cover layer disposed upon said photovoltaic cell, said cover layer comprising a material adapted to restrict transmission, by either absorption or reflection, of illumination having wavelengths outside of the range of the wavelength of said laser beam, and to transmit said laser beam towards said photovoltaic cell;

wherein:
   said laser beam has a first wavelength between 700 nm and 1500 nm;
   said wavelengths of said illumination outside of the range of said wavelength of said laser beam fall within a second range of wavelengths of 550 nm to 700 nm;
   the transmission of said cover layer for said wavelength of said laser beam is at least 50% higher than its transmission for wavelengths within the second range of 550 nm to 700 nm, such that said power converting device has an efficiency of conversion to electrical power at said wavelength of said laser beam at least 2.5 times higher than its efficiency at a wavelength of 550 nm;
   said cover layer being configured to absorb or reflect at least a third wavelength between 300 nm and 550 nm, so that at least 50% of the power of said third wavelength is absorbed or reflected before reaching said at least one junction, when illuminated through said cover layer from any direction between ±20° to the normal to the surface of said external layer, and said power converting device conversion efficiency for said third wavelength being less than 10%; and
   said power converting device conversion efficiency for a fourth wavelength between 1500 nm and 2000 nm being below 5%.

2. A power converting device for converting optical power into electrical power adapted for optical wireless power transmission using a laser beam, comprising:
   a power converting device having at least one junction having a bandgap energy between 0.75 eV and 1.2 eV, and having an external layer through which laser light is transmitted towards said at least one junction, said external layer being configured to transmit at least a first wavelength into said at least one junction with at least 80% efficiency when illuminated through said external layer from any direction between ±20° to the normal to the surface of said external layer; wherein at least one of:
   the conversion efficiency of said power converting device for said first wavelength being at least 30%, said first wavelength being a near infra-red wavelength between 700 nm and 1500 nm;
   said power converting device external layer being configured to reflect or absorb a portion of incident illumination at a second wavelength between 550 nm and 700 nm, so that less than 60% of the illumination at said second wavelength reaches the at least one junction when illuminated through said external layer from any direction between ±20° to the normal to the surface of said external layer and said power converting device conversion efficiency for said second wavelength is at below 20%;
   said power converting device external layer being configured to absorb or reflect at least a third wavelength between 300 nm and 550 nm, so that at least 50% of the power of said third wavelength is absorbed or reflected before reaching said at least one junction, when illuminated through said external layer from any direction between ±20° to the normal to the surface of said external layer, and said power converting device conversion efficiency for said third wavelength being less than 10%; and
   said power converting device conversion efficiency for a fourth wavelength between 1500 nm and 2000 nm being below 5%.

3. A power converting device for converting optical power into electrical power adapted for optical wireless power transmission using a laser beam, said power converting device comprising:
- a photovoltaic cell having a plurality of conductors on a surface adapted to receive said laser beam, said photovoltaic cell having at least one junction having a bandgap energy between 0.75 eV and 1.2 eV; and
- a cover layer disposed upon said photovoltaic cell, said cover layer comprising a material adapted to restrict transmission, by either absorption or reflection, of illumination having wavelengths outside of the range of the wavelength of said laser beam, and to transmit said laser beam towards said photovoltaic cell;

wherein:

said laser beam has a first wavelength between 700 nm and 1500 nm;

said wavelengths of said illumination outside of the range of said wavelength of said laser beam fall within a second range of wavelengths of 550 nm to 700 nm;

said transmission of said cover layer for said wavelength of said laser beam is at least 50% higher than its transmission for wavelengths within the second range of 550 nm to 700 nm, such that said power converting device has an efficiency of conversion to electrical power at said wavelength of said laser beam at least 2.5 times higher than its efficiency at a wavelength of 550 nm; and at least a portion of said light reflected by said plurality of conductors is reflected at angles which undergo total internal reflection from the top surface of said cover layer.

* * * * *